United States Patent
Oba et al.

(10) Patent No.: US 12,312,510 B2
(45) Date of Patent: May 27, 2025

(54) ADHESIVE FILM AND FLEXIBLE PRINTED CIRCUIT BOARD

(71) Applicant: MEKTEC CORPORATION, Tokyo (JP)

(72) Inventors: Hisae Oba, Tokyo (JP); Hiroyuki Komori, Kanagawa (JP); Nozomu Suzuki, Kanagawa (JP)

(73) Assignee: MEKTEC CORPORATION, Tokyo (JP)

( * ) Notice: Subject to any disclaimer, the term of this patent is extended or adjusted under 35 U.S.C. 154(b) by 171 days.

(21) Appl. No.: 17/109,440

(22) Filed: Dec. 2, 2020

(65) Prior Publication Data

US 2021/0163790 A1 Jun. 3, 2021

(30) Foreign Application Priority Data

Dec. 2, 2019 (JP) ................................. 2019-218329
Oct. 19, 2020 (JP) ................................. 2020-175552

(51) Int. Cl.
| | | |
|---|---|---|
| *C09J 7/25* | (2018.01) | |
| *C08G 73/10* | (2006.01) | |
| *C09J 127/16* | (2006.01) | |
| *C09J 127/20* | (2006.01) | |
| *H05K 1/03* | (2006.01) | |
| *H05K 3/46* | (2006.01) | |

(52) U.S. Cl.
CPC ............ *C09J 7/25* (2018.01); *C08G 73/1007* (2013.01); *C08G 73/1067* (2013.01); *C09J 127/16* (2013.01); *C09J 127/20* (2013.01); *H05K 1/0393* (2013.01); *H05K 3/4688* (2013.01); *C09J 2479/08* (2013.01); *H05K 2201/0141* (2013.01); *H05K 2201/015* (2013.01); *H05K 2201/05* (2013.01)

(58) Field of Classification Search
CPC .. C08F 214/184; C08F 214/28; C08F 214/22; C08L 79/08; B32B 7/12; B32B 2379/08; C09J 7/25; C09J 127/20; H05K 1/0393
See application file for complete search history.

(56) References Cited

U.S. PATENT DOCUMENTS

| | | | |
|---|---|---|---|
| 10,875,283 B2 | 12/2020 | Okimura et al. | |
| 2013/0316170 A1 | 11/2013 | Uchiyama et al. | |
| 2016/0242274 A1* | 8/2016 | Hosoda | .................. B32B 15/08 |
| 2016/0280979 A1 | 9/2016 | Uchiyama et al. | |
| 2017/0259544 A1 | 9/2017 | Okimura et al. | |
| 2021/0214543 A1* | 7/2021 | O'Keeffe | ............. C08K 5/0025 |

FOREIGN PATENT DOCUMENTS

| | | | | |
|---|---|---|---|---|
| CN | 103450827 A | | 12/2013 | |
| CN | 106536658 A | | 3/2017 | |
| CN | 110003806 | * | 7/2019 | |
| JP | H10-219109 A | | 8/1998 | |
| JP | H10-292010 A | | 11/1998 | |
| JP | H11-228931 A | | 8/1999 | |
| JP | 3175338 B2 | | 6/2001 | |
| JP | 3555354 B2 | | 8/2004 | |
| JP | 2004238634 A | * | 8/2004 | ........... C08G 59/027 |
| JP | 2004-289077 A | | 10/2004 | |
| JP | 2010-023380 A | | 2/2010 | |
| JP | 2013-245320 A | | 12/2013 | |
| JP | 2014159511 A | * | 9/2014 | |
| WO | WO 2019155073 | * | 8/2019 | |

OTHER PUBLICATIONS

Takahashi et al JP 2016042540, published on Mar. 31, 2016.*
An Office Action mailed by China National Intellectual Property Administration on Mar. 6, 2024, which corresponds to Chinese Patent Application No. 202011393467.9 and is related to U.S. Appl. No. 17/109,440 with English language translation.

* cited by examiner

*Primary Examiner* — Gregory Listvoyb
(74) *Attorney, Agent, or Firm* — Studebaker Brackett PLLC

(57) ABSTRACT

An adhesive film includes: a resin film layer; and an adhesive layer laminated to the resin film layer, in which the adhesive layer includes an adhesive agent, the adhesive layer is in a B stage state, an oxygen transmission rate at 200° C. of the resin film layer, measured in accordance with JIS K7126-1, is $1.50 \times 10^{-10}$ cc·cm/cm²·sec·cmHg or less, and a 3% thermal weight reduction temperature of the adhesive agent is 320° C. or higher.

7 Claims, 1 Drawing Sheet

ADHESIVE FILM AND FLEXIBLE PRINTED CIRCUIT BOARD

CROSS-REFERENCE TO RELATED APPLICATION

This application claims priority from Japanese Patent Application No. 2019-218329 filed with the Japan Patent Office on Dec. 2, 2019 and Japanese Patent Application No. 2020-175552 filed with the Japan Patent Office on Oct. 19, 2020, the entire content of which is hereby incorporated by reference.

BACKGROUND

1. Technical Field

An aspect of the present disclosure relates to an adhesive film and a flexible printed circuit board.

2. Related Art

Power devices are used in electronic equipment used in electric trains, automobiles, and airplanes. Si semiconductors implemented to power devices are easily subject to thermal runaway at 150° C. or higher. Therefore, known power devices have been required to include a heat dissipation mechanism such as a cooling fan.

Under such circumstances, a SiC/GaN power semiconductor, which is excellent in heat resistance and operable even at a high temperature of 225° C., has appeared and attracts attention. Since a power device having a SiC/GaN power semiconductor does not need to include a cooling fan, the power device can be reduced in size and weight. Accordingly, an electronic circuit board implemented with a SiC/GaN semiconductor is also required to have heat resistance at a high temperature exceeding 200° C. in the same manner as the semiconductor.

As an electronic circuit board to be implemented with the semiconductor, a rigid circuit board including a glass cloth prepreg as its core or a flexible printed circuit board (hereinafter, also referred to as an FPC) which can be bent for use is used. Among these, there is an increasing demand for using a flexible printed circuit board, from the viewpoint of the reduction in size and weight of power devices.

An FPC having a general structure includes a support layer of a polyimide film having excellent heat resistance and insulation, a conductor such as a copper foil formed on the support layer, a cover film, and an adhesive agent existing between the support layer and the cover film. As the adhesive agent for a flexible printed circuit board, an adhesive agent containing as a main component thermosetting resin such as epoxy resin is generally used (for example, Japanese Patent No. 3175338).

However, for applying a flexible printed circuit board to uses of a power device having a SiC/GaN power semiconductor, the flexible printed circuit board is required to have high heat resistance. From such a viewpoint, JP-A-2010-023380 discloses a metallized polyimide film having a small heating dimensional change rate. Also, Japanese Patent No. 3555354 proposes using as a main component fluorine-based rubber having excellent thermal degradation resistance and mixing this fluorine-based rubber with epoxy resin.

SUMMARY

An adhesive film includes: a resin film layer; and an adhesive layer laminated to the resin film layer, in which the adhesive layer includes an adhesive agent, the adhesive layer is in a B stage state, an oxygen transmission rate at 200° C. of the resin film layer, measured in accordance with JIS K7126-1, is $1.50 \times 10^{-10}$ cc·cm/cm$^2$·sec·cmHg or less, and a 3% thermal weight reduction temperature of the adhesive agent is 320° C. or higher.

DETAILED DESCRIPTION

Figure 1:
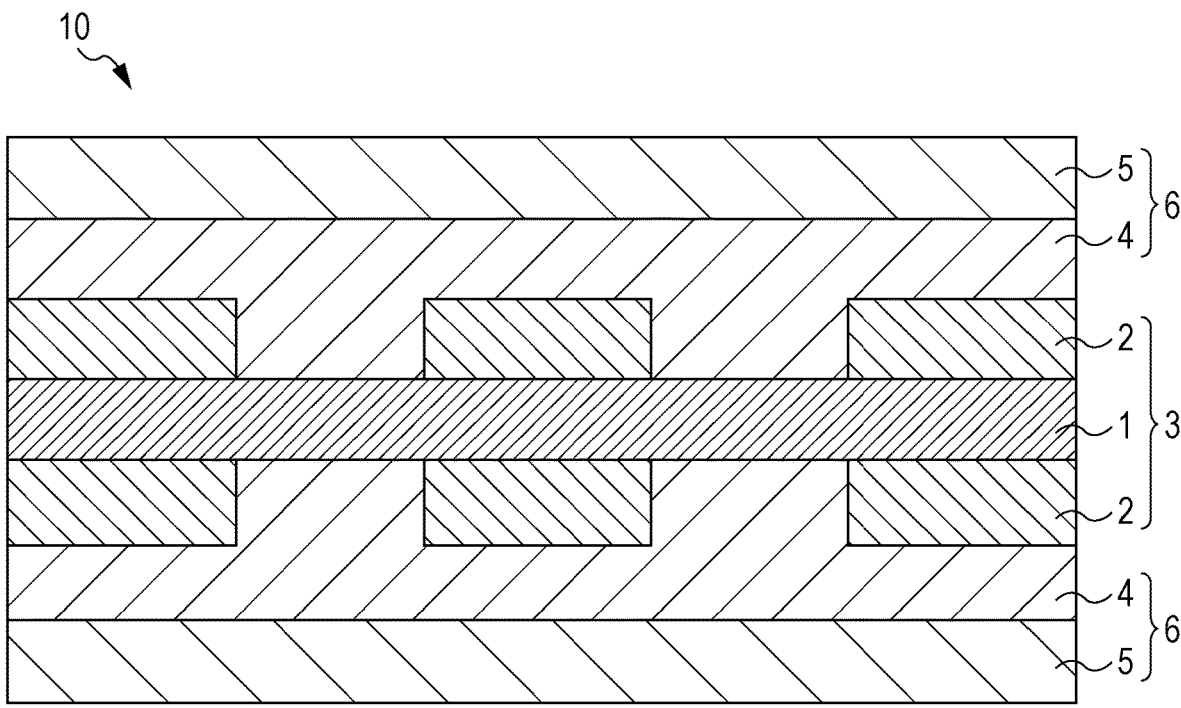
FIG. 1 is a schematic view illustrating an example of a first flexible printed circuit board according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

However, when an FPC is left to stand at a high temperature exceeding 200° C. for an extended period of time, peeling and cracking of an FPC occur due to oxidation degradation of a conductor and thermal degradation of an adhesive agent. Here, oxidation degradation of a conductor indicates that oxidation of a conductor causes generation of an oxide, and a cover film is easily peeled by diffusion of the oxide into an adhesive agent or by occurrence of peeling between a layer of the oxide and a layer in which an oxide is not generated.

It is proposed that a liquid crystal polymer (hereinafter, also referred to as an LCP) is used in a cover film for a purpose of suppressing the oxidation degradation of a conductor. However, an LCP has a large thermal expansion coefficient. Therefore, it was found that an LCP is thermally degraded while used for a long period of time, which can lead to deformation of a circuit board, breakage of a circuit, and the like.

Also, it is proposed that polyethylene terenaphthalate (hereinafter, also referred to as PEN) or the like is used in a cover film. However, it was found that PEN is easily deformed by heat.

Furthermore, with respect to a used adhesive agent, it was found that an epoxy-based adhesive agent generally used in a flexible printed circuit board can be embrittled under high temperature environments exceeding 200° C.

An object of the present disclosure is to provide an adhesive film and a flexible printed circuit board which are excellent in heat resistance.

The present inventors intensively conducted research. As a result, it was found that the above-described object can be achieved by an adhesive film having the following structure and a flexible printed circuit board including the adhesive film.

An adhesive film according to an aspect of the present disclosure includes: a resin film layer; and an adhesive layer laminated to the resin film layer, in which the adhesive layer includes an adhesive agent, the adhesive layer is in a B stage state, an oxygen transmission rate at 200° C. of the resin film layer, measured in accordance with JIS K7126-1, is 1.50×

$10^{-10}$ cc·cm/cm²·sec·cmHg or less, and a 3% thermal weight reduction temperature of the adhesive agent is 320° C. or higher.

Also, a first flexible printed circuit board according to an aspect of the present disclosure includes a laminate containing at least a first conductor having a formed circuit pattern, a support layer, and a second conductor having a formed circuit pattern in this order, and the adhesive film, in which an adhesive layer of the adhesive film is in contact with both surfaces of the laminate.

Furthermore, a second flexible printed circuit board according to an aspect of the present disclosure includes a laminate containing at least a support layer and a conductor having a formed circuit pattern in this order, and the adhesive film, in which a surface having the conductor of the laminate is in contact with an adhesive layer of the adhesive film, and an oxygen transmission rate at 200° C. of the support layer is $1.50 \times 10^{-10}$ cc·cm/cm²·sec·cmHg or less.

According to the above-described aspects of the present disclosure, an adhesive film and a flexible printed circuit board which are excellent in heat resistance can be provided.

As described in the present disclosure, "XX or more and YY or less", "XX to YY", or the like which represents a numerical value range is a range containing the lower limit and the upper limit as end points, unless otherwise stated.

When numerical value ranges are described in a stepwise manner, the upper limits and the lower limits of the numerical value ranges can be optionally combined.

An adhesive film and a flexible printed circuit board according to an embodiment of the present disclosure will be described.

The adhesive film according to the present embodiment is an adhesive film including a resin film layer and an adhesive film laminated on the resin film layer, in which the adhesive layer contains an adhesive agent, the adhesive layer is in a B stage state, an oxygen transmission rate at 200° C. of the resin film layer, measured in accordance with JIS K7126-1, is $1.50 \times 10^{-10}$ cc·cm/cm²·sec·cmHg or less, and a 3% thermal weight reduction temperature of the adhesive agent is 320° C. or higher.

Also, the first flexible printed circuit board according to the present embodiment includes a laminate containing at least a first conductor having a formed circuit pattern, a support layer, and a second conductor having a formed circuit pattern in this order, and the adhesive film of the present embodiment, in which an adhesive layer of the adhesive film is in contact with both surfaces of the laminate.

Furthermore, the second flexible printed circuit board according to the present embodiment includes a laminate containing at least a support layer and a conductor having a formed circuit pattern in this order, and the adhesive film according to the present embodiment, in which a surface having the conductor of the laminate is in contact with an adhesive layer of the adhesive film, and an oxygen transmission rate at 200° C. of the support layer is $1.50 \times 10^{-10}$ cc·cm/cm²·sec·cmHg or less.

The present inventors firstly paid attention on the oxygen transmission rate of the resin film layer.

It was found that polyimide, which has been used as a support layer and a cover film of a flexible printed circuit board, generally has a high oxygen transmission rate. Therefore, it was found that in a flexible printed circuit board including polyimide, oxygen in the air can be transmitted through the polyimide and an adhesive agent, and the oxygen and a conductor react to form an oxide, leading to oxidation degradation of the conductor. This phenomenon is significant under high temperature environments exceeding 200° C.

To address this concern, the present inventors found the following fact. That is, when a resin film having a lower oxygen transmission rate under high temperature environments, among resin films, is used, specifically, when a resin film layer having an oxygen transmission rate at 200° C. of $1.50 \times 10^{-10}$ cc·cm/cm²·sec·cmHg or less is used, oxidation degradation of a conductor under high temperature environments is suppressed, which can suppress a decrease in peel strength of a cover film.

The present inventors further paid attention on the 3% thermal weight reduction temperature of an adhesive agent.

As a result of research by the present inventors, it was found that a general epoxy-based adhesive agent, which has been used in a flexible printed circuit board, is thermally decomposed and accordingly reduced in molecular weight under high temperature environments exceeding 200° C., and such a reduction in molecular weight causes an adhesive agent to be embrittled.

To address this concern, the present inventors found the following fact. That is, when an adhesive agent having high heat resistance is used, specifically, when an adhesive agent having a 3% thermal weight reduction temperature of 320° C. or higher is used, embrittlement of an adhesive agent due to reduction in molecular weight can be suppressed even under high temperature environments exceeding 200° C. Therefore, a flexible printed circuit board having excellent heat resistance, which can endure even a use in a power device having a SiC/GaN power semiconductor, can be provided.

Hereinafter, materials used in the present embodiment will be described.

<Resin Film Layer>

The adhesive film includes a resin film layer. An oxygen transmission rate at 200° C. of the resin film layer, measured in accordance with JIS K7126-1, is $1.50 \times 10^{-10}$ cc·cm/cm²·sec·cmHg or less.

The oxygen transmission rate is preferably $1.00 \times 10^{-10}$ cc·cm/cm²·sec·cmHg or less, and more preferably $1.00 \times 10^{-11}$ cc·cm/cm²·sec·cmHg or less. The lower limit value of the oxygen transmission rate is, but not particularly limited to, preferably as low as possible and can be, for example, $1.00 \times 10^{-15}$ cc·cm/cm²·sec·cmHg or more.

The oxygen transmission rate can be controlled by a monomer component constituting the resin film. Also, the oxygen transmission rate can be controlled by coating the resin film with an organic layer or an inorganic layer, sticking an organic film or an inorganic film onto the resin film, or adding an organic filler or an inorganic filler to the resin film.

Details of the measurement method of the oxygen transmission rate will be described later.

The resin film layer is not particularly limited, as long as an oxygen transmission rate at 200° C. of $1.50 \times 10^{-10}$ cc·cm/cm²·sec·cmHg or less is satisfied. As the resin film layer, any known resin film can be used.

As the resin film layer, a polyimide film, a liquid crystal polymer, or the like can be used. Also, the resin film layer can contain at least one selected from the group consisting of a polyimide film and a liquid crystal polymer.

The resin film layer may include one type of single resin film or may be a film including two or more laminated resin films. Also, a metallized film in which metal such as aluminum is evaporated on a resin film can also be used as the resin film layer.

As such a resin film layer, UPILEX series (polyimide films manufactured by Ube Industries, Ltd.), Vecstar series (liquid crystal polymers manufactured by Kuraray Co., Ltd.), and the like can be specifically used.

When Vecstar series liquid crystal polymers are used as the resin film layer, Vecstar CTF is preferable among Vecstar series, from the viewpoint of an oxygen transmission rate.

Also, when a polyimide film is used as the resin film layer, the polyimide film preferably contains polyimide that is a polymer of a tetracarboxylic acid component and a diamine component.

The tetracarboxylic acid component is, but not particularly limited to, preferably at least one selected from the group consisting of biphenyltetracarboxylic acids such as 3,3',4,4'-biphenyltetracarboxylic acid, pyromellitic acid, acid anhydrides thereof, and esterified products of lower alcohols thereof. The tetracarboxylic acid component more preferably contains 3,3',4,4'-biphenyltetracarboxylic acid, and further preferably 3,3',4,4'-biphenyltetracarboxylic acid dianhydride.

The diamine component is, but not particularly limited to, preferably at least one selected from the group consisting of 1,4-phenylenediamine, 1,3-phenylenediamine, 1,2-phenylenediamine, 2,4-diaminotoluene, 2,5-diaminotoluene, and 2,6-diaminotoluene.

The polyimide film more preferably contains at least one selected from the group consisting of 1,2-phenylenediamine, 1,3-phenylenediamine, and 1,4-phenylenediamine as well as a polyimide that is a polymer of a monomer containing at least 3,3',4,4'-biphenyltetracarboxylic acid dianhydride. Further preferably, the polyimide film contains a polyimide that is a polymer of a monomer containing at least 1,4-phenylenediamine and 3,3',4,4'-biphenyltetracarboxylic acid dianhydride.

It is preferable that the polyimide film contain the above-described polyimide, because unit structures of the polyimide overlap each other thereby to obtain a structure which is further unlikely to transmit oxygen.

A specific example of a polyimide film corresponding to the polymer of a monomer containing at least 1,4-phenylenediamine and 3,3',4,4'-biphenyltetracarboxylic acid dianhydride is a UPILEX-S.

<Adhesive Agent>

The adhesive film includes an adhesive layer laminated on the resin film layer. Also, the adhesive layer contains an adhesive agent. Furthermore, the 3% thermal weight reduction temperature of the adhesive agent is 320° C. or higher. The 3% thermal weight reduction temperature of the adhesive agent is preferably 350° C. or higher, and more preferably 370° C. or higher. The upper limit value of the 3% thermal weight reduction temperature is, but not particularly limited to, preferably 600° C. or lower, from the viewpoint of laser processability.

The 3% thermal weight reduction temperature can be controlled by optimization of a molecular structure, optimization of a crosslinking density, and the like.

The adhesive agent is not particularly limited, as long as a 3% thermal weight reduction temperature of 320° C. or higher is satisfied. As the adhesive agent, any known adhesive agent can be used. Examples of the adhesive agent may be an acryl rubber-based adhesive agent and an epoxy resin-based adhesive agent. Also, the adhesive agent may be an adhesive agent containing fluorine-based rubber. Among these, an adhesive agent containing fluorine-based rubber is preferable, from the viewpoint of heat resistance. The fluorine-based rubber may have an unsaturated bond. Although the fluorine-based rubber may not have an unsaturated bond, it is more preferable that it contain an unsaturated bond.

A fluorine-based rubber having an unsaturated bond can be obtained by introducing an unsaturated bond to fluorine-based rubber through any known method. An example of the method is a method by basic modification such as alkali modification.

The present inventors estimate that a reason why heat resistance of the adhesive agent improves when the adhesive agent contains fluorine-based rubber is as follows.

It is known that a bonding energy between carbon and fluorine (between C—F) is larger than a bonding energy between carbon and hydrogen (between C—H). Therefore, rubber can be modified with fluorine to increase C—F bonds, so that breakage of a bond between elements due to heat is unlikely to occur. Also, when attention is paid on facilitating rotation of a bond between carbon and carbon (between C—C) in a main chain of resin, rotation of the above-described bond between carbon and carbon is less likely to occur, and a bonding energy is larger, when fluorine modification is performed (that is, in a case of —CF$_2$—) than when fluorine modification is not performed (that is, in a case of —CH$_2$—). Accordingly, decomposition due to heat is unlikely to occur, and heat resistance improves.

Furthermore, when the fluorine-based rubber has an unsaturated bond, the unsaturated bond and a later-described thermosetting resin can react to further increase heat resistance.

An example of the fluorine-based rubber is a polymer or a copolymer of at least one monomer selected from the group consisting of vinyl fluoride, vinylidene fluoride, hexafluoropropene, tetrafluoroethylene, and the like. More preferably, the fluorine-based rubber is a copolymer of at least one monomer selected from the group consisting of vinylidene fluoride, hexafluoropropene, tetrafluoroethylene, and the like. The copolymer is preferably a binary copolymer or a ternary copolymer, and more preferably a binary copolymer.

Also, an example of the fluorine-based rubber containing an unsaturated bond is an unsaturated bond-introduced product of the above-described polymer or copolymer.

In the copolymer, fluorinated olefin, olefin, vinyl compounds, and the like, such as ethylene, propylene, alkyl vinyl ether, hexafluoroisobutene, and vinyl acetate, may be copolymerized, to a degree that does not impair the effects of the present embodiment.

Specific examples of the fluorine-based rubber include polytetrafluoroethylene, polychlorotrifluoroethylene, polyvinyl fluoride, polyvinylidene fluoride, vinylidene fluoride-hexafluoropropene copolymers, tetrafluoroethylene-hexafluoropropene copolymers, chlorofluoroethylene-vinylidene fluoride copolymers, and unsaturated bond-introduced product thereof.

The fluorine-based rubber is preferably a vinylidene fluoride-hexafluoropropene copolymer or an unsaturated bond-introduced product of the copolymer, and more preferably an unsaturated bond-introduced product of a vinylidene fluoride-hexafluoropropene copolymer. The copolymerization ratio (vinylidene fluoride:hexafluoropropene) by mass is preferably 3:7 to 9.5:0.5, and more preferably 5:5 to 9:1.

For the fluorine-based rubber, one type of fluorine-based rubber may be used individually, or two or more types of fluorine-based rubbers may be used in combination. Also, a fluorine-based rubber without an unsaturated bond and a fluorine-based rubber with an unsaturated bond may be used in combination.

The Mooney viscosity ($ML_{1+10}$(121° C.)) of the fluorine-based rubber or the fluorine-based rubber having an unsaturated bond is preferably 40 to 110. When the Mooney viscosity is within the above-described range, sheet processability is excellent, and an elastic modulus and an elongation ratio are within optimum ranges. Therefore, punching properties, adhesive strength at high temperature, solder heat resistance, adhesive strength after an endurance test at high temperature for an extended period of time, and processability in a B stage state are good. The Mooney viscosity ($ML_{1+10}$(121° C.)) is more preferably 50 to 100.

The Mooney viscosity can be controlled by, for example, the molecular weight of a material. For example, the Mooney viscosity can be increased by increasing the molecular weight.

The Mooney viscosity is measured in accordance with JIS K 6300-1(2013). Using a Mooney viscometer SMV-201 (manufactured by Shimadzu Corporation), viscosity is measured under the conditions of a temperature condition of 121° C., a preheating time of 1 minute, and a rotor rotation time of 10 minutes.

These polymers or copolymers may be treated, as necessary, with an alkaline substance such as potassium hydroxide, sodium hydroxide, cesium hydroxide, calcium hydroxide, calcium carbonate, and triethylamine at a temperature of preferably about 20 to 70° C., in the presence of a ketone-based solvent such as acetone and methyl ethyl ketone. Accordingly, a dehydrofluorination reaction can occur to form an unsaturated bond in the molecule.

The content of an unsaturated bond (content of —CH=CH—) in the fluorine-based rubber having an unsaturated bond is preferably 0.1% by mass to 30% by mass, and more preferably 0.5% by mass to 10% by mass. As the fluorine-based rubber and the fluorine-based rubber having an unsaturated bond, any commercially available product can also be used.

An example of the acryl rubber is a polymer of a vinyl monomer primarily containing (meth)acrylic acid alkyl ester.

Examples of the (meth)acrylic acid alkyl ester include a monomer such as ethyl (meth)acrylate, propyl (meth)acrylate, butyl (meth)acrylate, hexyl (meth)acrylate, octyl (meth) acrylate, 2-ethylhexyl (meth)acrylate, undecyl (meth)acrylate, and lauryl (meth)acrylate, a monomer having a hydroxyl group such as 2-hydroxyethyl (meth)acrylate, 2-hydroxylpropyl (meth)acrylate, and allyl alcohol, and a monomer having an epoxy group of an epichlorhydrin modified product such as glycidyl (meth)acrylate and dimethylaminoethyl (meth)acrylate. One type of (meth)acrylic acid alkyl ester may be used individually, or two or more types of (meth)acrylic acid alkyl esters may be used in combination.

Examples of a vinyl monomer other than (meth)acrylic acid alkyl ester include a monomer having a carboxyl group such as acrylic acid and methacrylic acid, acrylonitrile, and styrene. However, a vinyl monomer other than (meth)acrylic acid alkyl ester is not limited to these. One type of vinyl monomer other than (meth)acrylic acid alkyl ester may be used individually, or two or more types of vinyl monomers other than (meth)acrylic acid alkyl ester may be used in combination.

In the acryl rubber, a monomer other than a vinyl monomer may be copolymerized. That is, the acryl rubber may be a copolymer of a vinyl monomer and a monomer other than a vinyl monomer. An example of a monomer other than a vinyl monomer is a monomer having a carboxyl group, such as itaconic acid, crotonic acid, maleic acid, and maleic anhydride. However, a monomer other than a vinyl monomer is not limited to these. One type of monomer other than a vinyl monomer may be used individually, or two or more types of monomers other than a vinyl monomer may be used in combination.

In general, the acryl rubber has high thermal stability of a saturated bond of the main chain as well as heat resistance and oil resistance following fluorine-based rubber and is used for automobile applications or the like. Also, the use of acrylonitrile as a monomer to serve as a raw material of acryl rubber is preferable, because a nitrile group promotes polarization between C—C of the main chain to further increase bonding strength.

The acryl rubber is preferably synthesized by a suspension polymerization method. A suspension polymerization method does not require a salting-out process. Therefore, acryl rubber synthesized by a suspension polymerization method is unlikely to be affected by an emulsifier which causes migration to decrease. As acryl rubber synthesized by a suspension polymerization method, a product produced by any known method or any commercially available product can be used without any particular limitation. An example of a commercially available acryl rubber is a Teisan Resin SG708-6 manufactured by Nagase ChemteX Corporation.

<Thermosetting Resin>

The adhesive agent may be an adhesive agent composition. The adhesive agent composition can contain thermosetting resin.

The softening point of thermosetting resin is preferably 30° C. or higher. That is, thermosetting resin is preferably in a solid state at normal temperature (25° C.). The softening point of thermosetting resin is more preferably 30° C. to 160° C., further preferably 40° C. to 160° C., further more preferably 50° C. to 150° C., and particularly preferably 60° C. to 130° C.

In a production process of a printed circuit board such as a flexible printed circuit board, an adhesive agent (adhesive layer) in a B stage (semi-curing) state before hot pressing is sometimes subjected to processing such as punching for implementing parts. When thermosetting resin having a softening point within the above-described range and being in a solid state at normal temperature is used, mixing properties of thermosetting resin and acryl rubber or fluorine-based rubber are good. Accordingly, combined with a later-described elastic modulus improving effect of an inorganic filler, the processability of the adhesive agent in a B stage state further improves.

The softening point of resin can be measured in accordance with the ring and ball method of JIS K 7234. An example of a usable measuring device is a Mettler softening point measuring device (FP900 Thermo system) manufactured by Mettler Toledo Inc.

Thermosetting resin is preferably one of phenolic resin and epoxy resin or a mixture of two or more types thereof, from the viewpoint of reactivity and heat resistance.

Examples of epoxy resin include bisphenol-type epoxy resin such as bisphenol A-type epoxy resin, bisphenol F-type epoxy resin, and bisphenol S-type epoxy resin, novolac-type epoxy resin such as phenol novolac-type epoxy resin, cresol novolac-type epoxy resin, and bisphenol A novolac-type epoxy resin, alicyclic epoxy resin, aliphatic chain epoxy resin, diglycidyl etherified products of biphenol, diglycidyl etherified products of naphthalene diol, diglycidyl etherified products of phenols, diglycidyl etherified products of alcohols, alkyl substituted bodies thereof, and hydrogenated products thereof. One type of epoxy resin may be used individually, or a mixture of two or more types of epoxy resins may be used.

Phenolic resin is obtained by adding acid or alkali as a catalyst to phenols and aldehydes and causing the mixture to react.

Examples of phenols include phenol, metacresol, paracresol, orthocresol, isopropylphenol, and nonylphenol.

Examples of aldehydes include formaldehyde, paraformaldehide, acetaldehyde, paraacetaldehyde, butyraldehyde, octylaldehyde, and benzaldehyde. In general, formaldehyde or paraformaldehide is used as aldehydes. In addition, vegetable oil-modified phenolic resin can also be used as aldehydes. Vegetable oil-modified phenolic resin is obtained by causing phenols and vegetable oil to react in the presence of an acid catalyst and subsequently causing aldehydes to react in the presence of an alkali catalyst. An example of the acid catalyst is a paratoluenesulfonic acid. An example of the alkali catalyst is an amine-based catalyst such as ammonia, trimethylamine, or triethylamine.

Also, examples of usable thermosetting resin include xylene resin, guanamine resin, diallyl phthalate resin, vinyl ester resin, unsaturated polyester resin, furan resin, polyimide resin, polyurethane resin, cyanate resin, maleimide resin, and benzocyclobutene resin.

Thermosetting resin preferably contains epoxy resin and is preferably epoxy resin. Epoxy resin is preferably cresol novolac-type epoxy resin and more preferably o-cresol novolac-type epoxy resin. As such epoxy resin, any commercially available product may be used. Examples of a commercially available epoxy resin include a YDCN700-10 (Nippon Steel & Sumikin Chemical Co., Ltd.) and an N695 (DIC Corporation).

The content of thermosetting resin, with respect to 100 parts by mass of fluorine-based rubber, is preferably 8 parts by mass to 120 parts by mass. When the content of thermosetting resin is within the above-described range, the adhesive agent can have good punching properties and adhesive strength at high temperature. The content is more preferably 8 parts by mass to 110 parts by mass, and further preferably 8 parts by mass to 100 parts by mass.

When the adhesive agent is an acryl rubber-based adhesive agent, acryl rubber is preferably used in combination with thermosetting resin. The thermosetting resin is preferably epoxy resin, phenolic resin, or a mixture thereof, from the viewpoint of reactivity and heat resistance. It is noted that the above-described epoxy resin and phenolic resin can be favorably used even if the weigh average molecular weight, the softening point, and the like of the epoxy resin and phenolic resin are not particularly limited.

The content of thermosetting resin used in combination with acryl rubber, with respect to 100 parts by mass of acryl rubber, is preferably 10 parts by mass to 200 parts by mass, more preferably 15 parts by mass to 150 parts by mass, and particularly preferably 20 parts by mass to 120 parts by mass. When this content is 10 parts by mass or more, the heat resistance of the adhesive agent further improves. Also, when this content is 200 parts by mass or less, the adhesive properties of the adhesive agent further improves.

<Inorganic Filler>

The adhesive agent composition can contain an inorganic filler. As the inorganic filler, any known material can be used. The inorganic filler preferably has electrical insulation properties.

Examples of the inorganic filler include silica, aluminum hydroxide, magnesium hydroxide, calcium hydroxide, calcium silicate, aluminum silicate, calcium carbonate, aluminum oxide, magnesium oxide, antimony oxide, tin oxide, titanium oxide, manganese oxide, zirconium oxide, silicon nitride, aluminum nitride, boron nitride, talc, mica, and kaolin.

Acryl rubber and fluorine-based rubber have a low elastic modulus. Therefore, during processing of the adhesive agent in a B stage state, burrs of the adhesive agent and adhesion of the adhesive agent to a processed portion sometimes occur. On the other hand, when an inorganic filler is used as an adhesive agent composition, an elastic modulus can be improved, and processability becomes good.

The inorganic filler preferably has thixotropy so that it aggregates to some extent to facilitate enhancement of an elastic modulus. From such a viewpoint, the inorganic filler is preferably silica, aluminum hydroxide, talc, or the like, and more preferably silica. Usable silica is not particularly limited, and may be dry silica, wet silica, or the like. As the silica, any commercially available product can also be used. An example of a commercially available silica is an Aerosil 200 (Nippon Aerosil Co., Ltd.).

The inorganic filler may be subjected to a hydrophobization treatment. Examples of a hydrophobization treatment include a silicone oil treatment and a silane coupling agent treatment.

The number mean diameter of primary particles of the inorganic filler is preferably 10 nm to 100000 nm, and more preferably about 50 nm to 10000 nm.

The content of the inorganic filler, with respect to 100 parts by mass of fluorine-based rubber, is preferably 1 part by mass to 35 parts by mass, more preferably 1 part by mass to 30 parts by mass, and further preferably 3 parts by mass to 25 parts by mass. When the content of the inorganic filler is within the above-described range, the adhesive agent can have good adhesive properties, solder heat resistance, and endurance at high temperature for an extended period of time, in addition to good processability.

<Amine Compound>

The adhesive agent composition may contain an amine compound as a curing agent.

A preferable curing agent of the epoxy resin as thermosetting resin is dicyandiamide which is low in curing onset temperature and excellent in stability at normal temperature. As necessary, an imidazole compound may be used as a curing promoter.

Also, a preferable curing agent of the fluorine-based rubber having an unsaturated bond is an aromatic diamine compound, from the viewpoint of curing properties.

An example of the aromatic diamine compound is a compound represented by the following formula (I).

[In formula (I), $R^1$ and $R^2$ are each independently an alkyl group having 1 to 6 carbons. $R^3$ is at least one selected from the group consisting of an alkylene group, an aromatic hydrocarbon group, a carbonyl group, a fluorene group, a sulfonyl group, an ether group, and a sulfide group, each having 1 to 6 carbons. m and n are each an integer of 0 to 4.]

Examples of a preferable alkyl group include a methyl group, an ethyl group, and a propyl group. From the viewpoint of curing properties, the alkyl group is preferably a methyl group or an ethyl group.

Examples of a preferable alkylene group include a methylene group and an ethylene group. From the viewpoint of curing properties, the alkylene group is preferably a methylene group.

From the viewpoint of further improving storage stability and fast curing properties, m and n are each independently an integer of preferably 0 to 2, more preferably 1 or 2, and further preferably 2.

In the formula, the position of —$NH^2$ is preferably para with respect to $R^3$, from the viewpoint of curing properties.

The aromatic hydrocarbon group is not particularly limited, as long as it is divalent. An example of the aromatic hydrocarbon group is phenylene. The aromatic hydrocarbon group can have a substituent such as a methyl group.

$R^3$ may be a substituent including a combination of an aromatic hydrocarbon group and an alkylene group. The combination of an aromatic hydrocarbon and an alkylene group is not particularly limited. An example of this substituent is an alkylene group having an aromatic hydrocarbon group. Specific examples of an aspect of a bond between an aromatic hydrocarbon and an alkylene group include an aspect in which two alkylene groups bind via an aromatic hydrocarbon, an aspect in which an aromatic hydrocarbon is bound as a side chain of an alkylene group, and an aspect in which an aromatic hydrocarbon group and an alkylene group bind and individually bind to two benzene rings illustrated in formula (I). Examples of the aromatic hydrocarbon include a benzene ring and naphthalene. The aromatic hydrocarbon can have a substituent such as a methyl group.

Among the compounds illustrated in formula (I), 4,4'-methylenebis(2-ethyl-6-methylaniline) is particularly preferable.

The content of the amine compound, with respect to 100 parts by mass of fluorine-based rubber, is preferably 0.1 part by mass to 20 parts by mass, and more preferably 1 part by mass to 10 parts by mass. Also, according to a preferable aspect, the content of the amine compound, with respect to 100 parts by mass of epoxy resin, is 0.5 part by mass to 30 parts by mass.

<Adhesive Agent Composition>

The above-described adhesive agent composition can be obtained by mixing acryl rubber or fluorine-based rubber and, as necessary, other additives such as thermosetting resin, an inorganic filler, and a curing agent. In mixing, an organic solvent may be used as necessary.

The above-described adhesive agent or adhesive agent composition is preferably suitable for the production of a flexible printed circuit board.

For example, an adhesive film including the adhesive agent or the adhesive agent composition is obtained, and this adhesive film can also be used for the production of a flexible printed circuit board.

The elastic modulus of the adhesive layer (or the elastic modulus when the adhesive agent composition becomes in a B stage state (semi-curing state)), measured in accordance with the test method of tensile properties in JIS K 7127, is preferably 15 MPa or more. This elastic modulus is more preferably 20 MPa or more. The upper limit of this elastic modulus is not particularly limited. However, this elastic modulus is preferably 3000 MPa or less, more preferably 1000 MPa or less, and further preferably 100 MPa or less.

The break elongation rate of the adhesive layer (or the break elongation rate when the adhesive agent composition becomes in a B stage state (semi-curing state)), measured in accordance with the test method of tensile properties in JIS K 7127 (1999), is preferably less than 400%. This break elongation rate is more preferably less than 300%, and further preferably less than 200%. The lower limit of this break elongation rate is not particularly limited. However, this break elongation rate is preferably 50% or more, and more preferably 100% or more.

When the elastic modulus and break elongation rate are within the above-described ranges, the adhesive agent composition has good processability. The elastic modulus and break elongation rate can be controlled by the softening point of thermosetting resin, the Mooney viscosity of fluorine-based rubber, the content of an inorganic filler, and the like.

The adhesive film can be produced by any known method. For example, an organic solvent solution of the above-described adhesive agent composition is prepared, and a resin film layer such as polyimide is coated with this organic solvent solution to form an adhesive layer. Then, the adhesive layer is dried under the conditions of, for example, 50° C. to 160° C. and 1 minute to 15 minutes, so that the adhesive layer becomes in a B stage state. Accordingly, an adhesive film is obtained. Thereafter, the obtained adhesive film can be bonded to an adherend and cured by heating.

When the above-described adhesive agent composition is used for bonding a cover film or a carrier film in the production of a flexible printed circuit board, the same bonding as described above can be performed to obtain a flexible printed circuit board including an adhesive layer containing a cured product of the adhesive agent composition. Punching or the like can also be performed to the adhesive layer as necessary, during a period from when the adhesive layer is in a B stage state to when it is cured by heating.

A method for obtaining the adhesive agent composition in a B stage state is not particularly limited, and any known method, including a method of drying by heating as described above, can be adopted.

The organic solvent is not particularly limited, and any known solvent can be used. Examples of the organic solvent include acetone, methyl ethyl ketone, tetrahydrofuran, chloroform, dimethylformamide, and methyl isobutyl ketone. The use amount of the organic solvent is not particularly limited. The use amount of the organic solvent, in terms of a solid content contained in the organic solvent, is preferably 10% by mass to 70% by mass, and more preferably 20% by mass to 40% by mass.

<Flexible Printed Circuit Board>

The first flexible printed circuit board according to the present disclosure includes a laminate containing at least a first conductor having a formed circuit pattern, a support layer, and a second conductor having a formed circuit pattern in this order, and the adhesive film of the present embodiment, in which an adhesive layer of the adhesive film is in contact with both surfaces of the laminate.

FIG. 1 is a schematic view illustrating an example of a first flexible printed circuit board 10 according to an embodiment of the present disclosure. In FIG. 1, a laminate 3 includes a support layer 1 and a conductor 2 bonded to both surfaces of the support layer 1. It is noted that for FIG. 1, the first conductor and the second conductor are collectively referred to as simply a "conductor 2". Also, an adhesive film 6 includes a resin film layer 5 and an adhesive layer 4 laminated on the resin film layer 5. The adhesive layer 4 of this adhesive film 6 is in contact with both surfaces of the laminate 3.

In the first flexible printed circuit board 10 having such a structure, transmission of oxygen through the first flexible printed circuit board 10 can be suppressed on both surfaces of the first flexible printed circuit board 10.

The first conductor and the second conductor are not particularly limited and can be formed with any known material. Examples of this material include copper, silver, gold, tin, aluminum, indium, and alloys thereof. The conductor is preferably a material containing copper, and more preferably copper foil. The material of the first conductor and the material of the second conductor may be the same as or different from each other.

The thickness of the first conductor and the thickness of the second conductor are, but not particularly limited to, preferably 5 to 70 μm, and more preferably 12.5 to 50 μm. The thickness of the first conductor and the thickness of the second conductor may be the same as or different from each other.

The support layer is not particularly limited. Examples of a usable support layer include polyimide, polyethylene naphthalate, polyethylene terephthalate, polybutylene terephthalate, polyphenylene sulfide, and other super engineering plastics. Preferably, the support layer is polyimide.

The thickness of the support layer is, but not particularly limited to, preferably 5 to 50 μm, and more preferably 12.5 to 30 μm. Also, the thickness of the support layer is preferably appropriately selected depending on its intended use.

Also, if the oxygen transmission rate at 200° C. of the support layer is $1.50 \times 10^{-10}$ cc·cm/cm$^2$·sec·cmHg or less, an aspect of a second flexible printed circuit board as described below can be achieved. This oxygen transmission rate at 200° C. of the support layer is preferably $1.00 \times 10^{-10}$ cc·cm/cm$^2$·sec·cmHg or less, and more preferably $1.00 \times 10^{-11}$ cc·cm/cm$^2$·sec·cmHg or less. This oxygen transmission rate is, for example, $1.00 \times 10^{-15}$ cc·cm/cm$^2$·sec·cmHg or more.

That is, a second flexible printed circuit board according to another embodiment of the present disclosure includes a laminate containing at least a support layer and a conductor having a formed circuit pattern in this order, and the adhesive film according to the present embodiment, in which a surface having the conductor of the laminate is in contact with an adhesive layer of the adhesive film, and an oxygen transmission rate at 200° C. of the support layer is $1.50 \times 10^{-10}$ cc·cm/cm$^2$·sec·cmHg or less.

Figure 2:
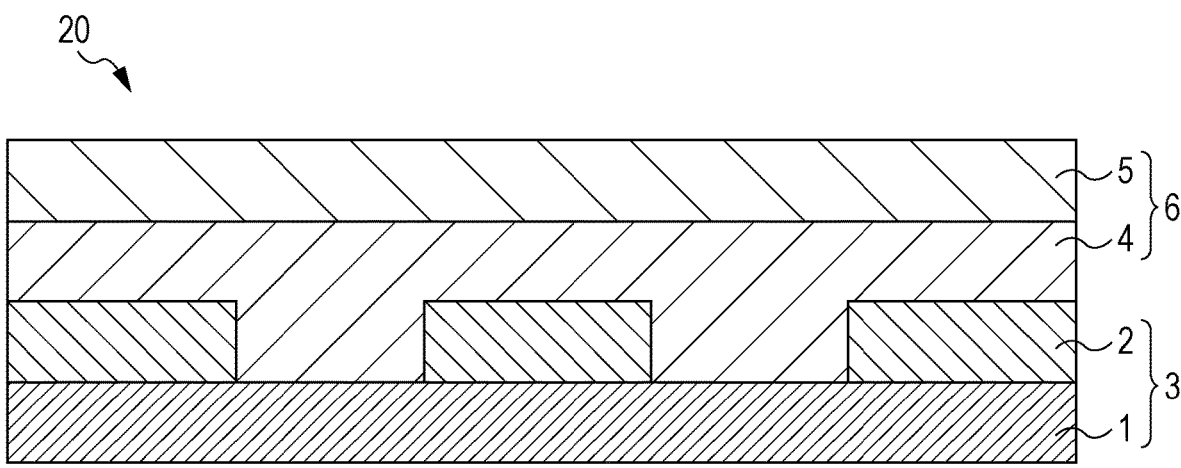
FIG. 2 is a schematic view illustrating an example of a second flexible printed circuit board according to another embodiment of the present disclosure.

FIG. 2 is a schematic view illustrating an example of a second flexible printed circuit board 20. In FIG. 2, a laminate 3 includes a support layer 1 and a conductor 2 bonded to one surface of the support layer 1. Also, an adhesive film 6 includes a resin film layer 5 and an adhesive layer 4 laminated on the resin film layer 5. The adhesive layer 4 of this adhesive film 6 is in contact with a surface having the conductor 2 of the laminate 3.

In the second flexible printed circuit board 20 having such a structure, oxygen transmission properties at 200° C. of the support layer 1 are low. Therefore, even when a surface without the conductor 2 of the laminate 3 is not in contact with the adhesive film 6 of the present embodiment, transmission of oxygen through the second flexible printed circuit board 20 can be suppressed.

As the conductor 2 of the second flexible printed circuit board 20, the same conductor as the first conductor and the second conductor of the first flexible printed circuit board 10 can be used.

Also, the support layer 1 according to the second flexible printed circuit board 20 is not particularly limited, as long as an oxygen transmission rate at 200° C. of $1.50 \times 10^{-10}$ cc·cm/cm$^2$·sec·cmHg or less is satisfied. An example of the support layer 1 to be used is the same layer as the resin film layer according to the adhesive film of the present embodiment.

EXAMPLES

Hereinafter, the present embodiment will be specifically described with reference to examples. However, the present embodiment is not limited to the following aspects of examples. Also, in the following formulation, "parts" is by mass, unless otherwise stated.

Using a polyimide film UPILEX-S (thickness 25 μm) manufactured by Ube Industries, Ltd. as a resin film, an oxygen transmission rate was measured. Also, an appearance after a heat resistance test was observed. The conditions are as follows. The result is indicated in Table 1.
(Measurement of oxygen transmission rate)
Measurement method: in accordance with attached document 2 of JIS K7126-1
Test gas species: oxygen
Test gas flow rate: 90 ml/min
Carrier gas species: helium
Carrier gas flow rate: 35 ml/min
Transmission area: 15.2 cm$^2$
Measuring device: GTR-10AH (200° C.) or GTR-30XANO (to 120° C.) manufactured by GTR TEC Corporation
Cell constant temperature bath temperature: 25° C., 120° C., 200° C.
Gas chromatograph calibration method: two points calibration by 0.0 μl and 15.3 μl
(Heat Resistance Test)
The resin film having a size of 100 mm square was heated under the atmospheric air condition in an oven at 200° C. or 250° C. for 500 hours. The appearance of the resin film after heating was evaluated based on the following criteria.
<Evaluation Criteria>
A: Warpage at all ends of a 100 mm square evaluation sheet is less than 10 mm.
B: Warpage at one or more ends of a 100 mm square evaluation sheet is 10 mm or more and less than 30 mm
C: Warpage at one or more ends of a 100 mm square evaluation sheet is 30 mm or more.

Measurement of an oxygen transmission rate and appearance observation after a heat resistance test were performed to each resin film by the same method except for the following changes. The result is indicated in Table 1.
Kapton EN-S: polyimide film Kapton EN-S (thickness 25 μm) manufactured by Du Pont-Toray Co., Ltd.
LCP-CTF: liquid crystal polymer Vecstar CTF (thickness 50 μm) manufactured by Kuraray Co., Ltd.
LCP-CTQ: liquid crystal polymer Vecstar CTQ (thickness 25 μm) manufactured by Kuraray Co., Ltd.
PEN: Teonex Q51 (thickness 25 μm) manufactured by Teijin Limited
PET: Lumirror 25S (thickness 25 μm) manufactured by Toray Industries, Inc.
Al/PET: aluminum vapor deposition PET Tetolight (thickness 12 μm) manufactured by Oike Advanced Film Co., Ltd.

TABLE 1

| Resin film | | UPILEX-S | Kapton EN-S | LCP-CTF | LCP-CTQ | PEN | PET | Al/PET |
|---|---|---|---|---|---|---|---|---|
| Oxygen transmission rate | 25° C. | 5.93E−14 | 6.89E−12 | 2.42E−14 | 2.62E−14 | 6.80E−13 | 3.17E−12 | 6.72E−14 |
| | 120° C. | 1.67E−12 | 5.05E−11 | 6.56E−12 | 6.18E−12 | 2.75E−11 | 1.21E−10 | 2.19E−12 |
| | 200° C. | 8.72E−12 | 2.00E−10 | 8.92E−11 | 1.04E−10 | 2.65E−10 | 9.00E−10 | 1.74E−11 |
| 200° C., 500 hours After heat resistance test | Appearance | A | A | A | A | A | C | C |
| 250° C., 500 hours After heat resistance test | Appearance | A | A | B | B | C | C | C |

As described in Table 1, "E-xx" indicates "×10$^{-xx}$". Also, the unit of an oxygen transmission rate is cc·cm/cm$^2$·sec·cmHg.

Example 1

Acryl rubber-based (A)
Acryl rubber (SG708-6 manufactured by Nagase ChemteX Corporation) 80 parts
Epoxy resin (solid, softening point 95° C.) o-cresol novolac-type epoxy resin (N695 (DIC Corporation)) 20 parts
Silica (fumed silica: Aerosil 200 (Nippon Aerosil Industries Co., Ltd.)) 15 parts
Curing agent: dicyandiamide 0.2 part These were dissolved with methyl ethyl ketone such that the above-described solid content became 30% by mass. Accordingly, an adhesive agent composition containing acryl rubber was obtained. The 3% thermal weight reduction temperature of the obtained adhesive agent composition was 330° C. It is noted that silica was dispersed using a bead mill.

Also, a solution of the obtained adhesive agent composition was applied onto a polyimide film (a polyimide film UPILEX-S manufactured by Ube Industries, Ltd., thickness 25 μm) such that the thickness after drying became 25 μm. Then, the applied product was dried at 140° C. for 3 minutes by a hot air dryer. Accordingly, an adhesive film in a B stage state (semi-curing state) was obtained.

An adhesive agent-coated surface of this adhesive film and a black-treated surface of a copper foil (BHY manufactured by JX Nippon Oil, thickness 18 μm) were thermocompression bonded to each other using a vacuum press laminator at 160° C. and 3 MPa for 30 seconds under reduced pressure. Thereafter, the obtained product was cured by heating at 160° C. for 10 hours to obtain a test sample of Example 1. The obtained test sample was evaluated as below. The result is indicated in Table 2.

Example 2

Fluorine-based rubber double bond modification (unsaturated modified product of binary copolymer between vinylidene fluoride and hexafluoropropene (copolymerization ratio: vinylidene fluoride/hexafluoropropene=8/2), Mooney viscosity (ML$_{1+10}$(121° C.)): 98, content of double bond: 4% by mass) 100 parts
Silica (fumed silica: Aerosil 200 (Nippon Aerosil Industries Co., Ltd.)) 15 parts
Epoxy resin (solid softening point 95° C.) o-cresol novolac-type epoxy resin (N695 (DIC Corporation)) 20 parts
Amine compound (4,4'-methylenebis(2-ethyl-6-methylaniline): Curehard MED-J manufactured by Kumiai Chemical Industry Co., Ltd.) 5 parts These were dissolved with methyl ethyl ketone such that the above-described solid content became 30% by mass. Accordingly, an adhesive agent composition containing fluorine-based rubber was obtained. The 3% thermal weight reduction temperature of the obtained adhesive agent composition was 373° C. It is noted that silica was dispersed using a bead mill.

Also, a solution of the obtained adhesive agent composition was applied onto a polyimide film (a polyimide film UPILEX-S manufactured by Ube Industries, Ltd., thickness 25 μm) such that the thickness after drying became 25 μm. Then, the obtained product was dried at 140° C. for 3 minutes by a hot air dryer. Accordingly, an adhesive film in a B stage state (semi-curing state) was obtained.

An adhesive agent-coated surface of this adhesive film and a black-treated surface of a copper foil (BHY manufactured by JX Nippon Oil, thickness 18 μm) were thermocompression bonded to each other using a vacuum press laminator at 160° C. and 3 MPa for 30 seconds under reduced pressure. Thereafter, the obtained product was cured by heating at 160° C. for 10 hours to obtain a test sample of Example 2. The obtained test sample was evaluated as below. The result is indicated in Table 2. (Peel strength (23° C.))

The peel strength of each test sample was measured by peeling the resin film of the test sample according to each of Examples 1 and 2 using a tensile tester (Autograph manufactured by Shimadzu Corporation) under the atmosphere at 23° C. in a 90° direction at a speed of 50 mm/min.

Also, the test sample according to each of Examples 1 and 2 was heated under the atmospheric air condition in an oven at 200° C. or 250° C. for 500 hours or 1000 hours. The peel strength of the test sample after heating was also measured in the same method.

A larger value of peel strength indicates that heat resistance is more excellent.

(Heat Resistance Test)

The test sample according to each of Examples 1 and 2 and the appearance of the test sample after heating were evaluated based on the following criteria.

<Evaluation Criteria>

A: No peeling occurred between the adhesive film and the copper foil, and the adhesive agent was not embrittled.

B: Peeling occurred between the adhesive film and the copper foil, but the adhesive agent was not embrittled.

C: The adhesive agent was embrittled, but no peeling occurred between the adhesive film and the copper foil.

D: The adhesive agent was embrittled, and peeling occurred between the adhesive film and the copper foil.

(Measurement Method of 3% Thermal Weight Reduction Temperature)

The 3% thermal weight reduction temperature of the adhesive agent was measured using a TGA Q500 manufactured by TA Instruments. The test conditions are as follows.
Temperature increasing rate: 20° C./min
Gas flow rate to a test layer including the sample: 20 mL/min
Sample pan: platinum Example 3 and Comparative Examples 1 to 8

Test samples of Example 3 and Comparative Examples 1 to 8 were obtained by the same method as in Examples 1 and 2, except that the resin film and the adhesive agent were changed as illustrated in Table 2. The obtained test samples were evaluated in the same manner as in Examples 1 and 2. The result is indicated in Table 2.

It is noted that the resin films and the adhesive agents illustrated in Table 2 are as follows.
(Resin Film)
Kapton EN-S: polyimide film Kapton EN-S manufactured by Du Pont-Toray Co., Ltd. (thickness 25 μm)
LCP-CTF: LCP Vecstar CTF manufactured by Kuraray Co., Ltd. (thickness 25 μm)
(Adhesive Agent)
Acryl rubber-based (B): Pyralux LF manufactured by Dupont (thickness 25 μm), 3% thermal weight reduction temperature: 310° C.
Epoxy resin-based: EPDX AH357 manufactured by Printec Corporation (thickness 25 μm), 3% thermal weight reduction temperature: 303° C.

cations and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An adhesive film comprising:
a resin film layer; and
an adhesive layer laminated to the resin film layer, wherein
the adhesive layer includes an adhesive agent,
the adhesive agent contains a fluorine-based rubber,
the adhesive layer is in a B stage state,
the resin film layer includes a liquid crystal polymer,
an oxygen transmission rate at 200° C. of the resin film layer, measured in accordance with JIS K7126-1, is $1.50 \times 10^{-10}$ cc·cm/cm²·sec·cmHg or less, and
a 3% thermal weight reduction temperature of the adhesive agent is 320° C. or higher.

2. The adhesive film according to claim 1, wherein the oxygen transmission rate is $1.00 \times 10^{-11}$ cc·cm/cm²·sec·cmHg or less.

3. The adhesive film according to claim 1, wherein
the fluorine-based rubber is a polymer or a copolymer of at least one monomer selected from the group consist-

TABLE 2

|  |  | Comparative Example 2 | Comparative Example 3 | Example 1 | Example 2 | Comparative Example 4 | Comparative Example 5 | Comparative Example 6 | Comparative Example 7 | Comparative Example 8 | Example 3 |
|---|---|---|---|---|---|---|---|---|---|---|---|
| Resin film |  | UPILEX-S | UPILEX-S | UPILEX-S | UPILEX-S | Kapton EN-S | Kapton EN-S | Kapton EN-S | LCP-CTF | LCP-CTF | LCP-CTF |
| Adhesive agent |  | Epoxy resin-based | Acryl rubber-based (B) | Acryl rubber-based (A) | Fluorine-based rubber | Epoxy resin-based | Acryl rubber-based (B) | Fluorine-based rubber | Epoxy resin-based | Acryl rubber-based (B) | Fluorine-based rubber |
| 3% thermal weight reduction temperature |  | 303° C. | 310° C. | 330° C. | 373° C. | 303° C. | 310° C. | 373° C. | 303° C. | 310° C. | 373° C. |
| Peel strength [N/mm] | Initial | 0.35 | 0.70 | 2.00 | 0.70 | 0.35 | 1.00 | 1.00 | 0.10 | 0.50 | 0.50 |
|  | 250° C., 500 hours | 0.20 | <0.20 | 0.50 | 1.10 | <0.20 | <0.20 | <0.20 | <0.20 | <0.20 | <0.20 |
|  | 250° C., 1000 hours | <0.20 | <0.20 | 0.20 | 1.00 | <0.20 | <0.20 | <0.20 | <0.20 | <0.20 | <0.20 |
| Appearance | Initial | A | A | A | A | A | A | A | A | A | A |
|  | 250° C., 500 hours | C | D | C | A | D | D | D | D | D | B |
|  | 250° C., 1000 hours | D | D | C | A | D | D | D | D | D | B |
| Peel strength [N/mm] | Initial | 0.35 | 0.70 | 2.00 | 0.70 | 0.35 | 1.00 | 1.00 | 0.10 | 0.50 | 0.50 |
|  | 200° C., 500 hours | 0.40 | 0.60 | 0.70 | 1.00 | 0.25 | 0.50 | 0.90 | <0.20 | 0.30 | 0.40 |
|  | 200° C., 1000 hours | <0.20 | 0.30 | 0.40 | 1.10 | <0.20 | 0.30 | 0.60 | <0.20 | <0.20 | 0.40 |
| Appearance | Initial | A | A | A | A | A | A | A | A | A | A |
|  | 200° C., 500 hours | C | B | B | A | D | B | A | C | B | A |
|  | 200° C., 1000 hours | D | B | B | A | D | B | A | D | D | A |

The foregoing detailed description has been presented for the purposes of illustration and description. Many modifiing of vinyl fluoride, vinylidene fluoride, hexafluoropropene, and tetrafluoroethylene.

4. The adhesive film according to claim 3, wherein the fluorine-based rubber is a vinylidene fluoride-hexafluoropropene copolymer.

5. The adhesive film according to claim 1, wherein the fluorine-based rubber has an unsaturated bond.

6. The adhesive film according to claim 1, wherein the adhesive layer includes an inorganic filler.

7. The adhesive film according to claim 1, wherein the adhesive agent consists of a polymer or copolymer of at least one monomer selected from the group consisting of vinyl fluoride, vinylidene fluoride, hexafluoropropene, and tetrafluoroethylene.

* * * * *